US008633749B2

(12) United States Patent
Bass et al.

(10) Patent No.: US 8,633,749 B2
(45) Date of Patent: Jan. 21, 2014

(54) PHASE-LOCKED LOOP (PLL) FAIL-OVER CIRCUIT TECHNIQUE AND METHOD TO MITIGATE EFFECTS OF SINGLE-EVENT TRANSIENTS

(75) Inventors: Derek E. Bass, Castle Rock, CO (US); John W. Pfeil, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 13/560,774

(22) Filed: Jul. 27, 2012

(65) Prior Publication Data

US 2013/0300473 A1 Nov. 14, 2013

Related U.S. Application Data

(60) Provisional application No. 61/644,874, filed on May 9, 2012.

(51) Int. Cl.
*H03L 7/06* (2006.01)

(52) U.S. Cl.
USPC .......................................... 327/158; 327/147

(58) Field of Classification Search
None
See application file for complete search history.

(56) References Cited

U.S. PATENT DOCUMENTS

| | | | |
|---|---|---|---|
| 5,122,679 A * | 6/1992 | Ishii et al. | 327/147 |
| 6,259,293 B1 * | 7/2001 | Hayase et al. | 327/276 |
| 6,282,210 B1 * | 8/2001 | Rapport et al. | 370/518 |
| 7,511,543 B2 * | 3/2009 | Friedman et al. | 327/156 |
| 7,539,278 B2 * | 5/2009 | Shumarayev et al. | 375/376 |
| 7,602,254 B2 * | 10/2009 | Sandner et al. | 331/2 |
| 7,809,971 B2 * | 10/2010 | Shimobeppu | 713/400 |
| 7,821,343 B1 * | 10/2010 | Wong et al. | 331/2 |
| 7,899,145 B2 * | 3/2011 | Li | 375/376 |
| 8,258,775 B2 * | 9/2012 | Canac | 324/76.77 |
| 2001/0043098 A1 * | 11/2001 | Locker et al. | 327/156 |
| 2011/0234277 A1 * | 9/2011 | Stephens et al. | 327/158 |

OTHER PUBLICATIONS

Boulghassoul, Y. et al., "Effects of Technology Scaling on the SET Sensitivity of RF CMOS Voltage-Controlled Oscillators," IEEE Transactions on Nuclear Science, vol. 52, No. 6, Dec. 2005, pp. 2426-2432, Downloaded from IEEE Xplore.

Narasimham, B. et al., "Characterization of Digital Single Event Transient Pulse-Widths in 130-nm and 90-nm CMOS Technologies," IEEE Transaction on Nuclear Science, vol. 54, No. 6, Dec. 2007, pp. 2506-2511, Downloaded from IEEE Xplore.

(Continued)

*Primary Examiner* — Cassandra Cox
(74) *Attorney, Agent, or Firm* — William J. Kubida; Peter J. Meza; Hogan Lovells US LLP

(57) ABSTRACT

A PLL fail-over circuit technique and method to mitigate the effects of single-event transients comprises providing a pair of substantially identical phase-locked loops and producing a respective delayed clock signal from each. The outputs of the phase-locked loops are monitored for errors comprising high frequency transients or differences in clock signal outputs from a reference frequency. A clock out signal is output representative of the first delayed clock signal if an error is detected in the second phase-locked loop and the second delayed clock signal is output if an error is detected in the first phase-locked loop.

20 Claims, 10 Drawing Sheets

(56) References Cited

OTHER PUBLICATIONS

Loveless, T.D. et al., "A Hardened-by-Design Technique for RF Digital Phase-Locked Loops," Department of Electrical Engineering and Computers Science, Vanderbilt University, Nashville, TN, Jul. 2006, pp. 1-7.

Loveless, T.D. et al., "A Radiation-Hardened-by-Design Voltage-Controlled Oscillator for Mixed-Signal Phase-Locked Loops," Vanderbilt University School of Engineering, Vanderbilt University, Nashville, TN, SEE Symposium 2008, slides pp. 1-16.

Kumar, R. et al., "A Radiation Tolerant Phase Locked Loop Design for Digital Electronics," Department of Electrical and Computer Engineering, Texas A&M University, College Station, TX, Oct. 2009, pp. 505-510.

Wang, T. et al., "A Single-Event Transients Tolerant Monolithic Phase-Locked Loops Design," Department of Electrical and Computer Engineering, University of Saskatchewan, Saskatoon, Canada, Mar. 2010, pp. 1-5.

\* cited by examiner

PHASE-LOCKED LOOP (PLL) FAIL-OVER CIRCUIT TECHNIQUE AND METHOD TO MITIGATE EFFECTS OF SINGLE-EVENT TRANSIENTS

CROSS REFERENCE TO RELATED PATENT APPLICATIONS

The present invention is related to, and claims priority from, U.S. Provisional Patent Application Ser. No. 61/644,874 for "PLL Failover" filed May 9, 2012, the disclosure of which is herein specifically incorporated by reference in its entirety.

BACKGROUND OF THE INVENTION

The present invention relates, in general, to the field of phase-locked loop (PLL) clocking circuits. More particularly, the present invention relates to a PLL fail-over circuit technique and method to mitigate the effects of single-event transients.

Energetic particle strikes leading to single-event transients (SETs) are an increasing concern for digital circuits encountering radiation environments. As device geometries become ever more reduced in size, they exhibit a concomitantly greater sensitivity to such SETs which can induce the generation of transients in the device leading to errors propagating through the system.

As data rates and processing speeds increase the need for stable, low jitter, phase-locked loop clocking sources is becoming increasingly more important. Systems exposed to harsh environments require highly reliable clock sources to ensure correct operation of critical systems. Single-event transient phenomena can cause more than just clocking errors in PLLs that negatively affect bit error rates and such phenomena have also been linked to system failure and catastrophic mission failure. See for example, Y. Boulghassoul, L. W. Massengill, A. L. Sternberg, and B. L. Bhuva, "Effects of Technology Scaling on the SET Sensitivity of RF CMOS Voltage-Controlled Oscillators," IEEE Transactions on Nuclear Science, vol. 52, no. 6, pp. 2426-2432, December 2005 (hereinafter the Boulghassoul et al. article).

While SET mitigation and performance are crucial, one must consider power consumption and footprint as well. Ever increasing system complexity and size reduction require PLL solutions that consume minimal power and area while maintaining robust performance against SET phenomena yet still provide excellent performance. Mitigation of SET effects without negatively impacting performance is a great challenge, but it is critical to creating a dependable clock source for operation in harsh environments.

Design of large, complex digital systems requires low jitter clocking to ensure maximum timing margins. Flight time, setup and hold margins, and propagation delay consume a large portion of the timing window for synchronous signals, especially when routing over large areas or through various media. This leaves less and less time for clock jitter as a component of the timing margins as system speeds increase and systems grow. SET induced clock jitter and clocking errors must therefore be minimized or eliminated to ensure robust operation of any timing critical systems.

SUMMARY OF THE INVENTION

Disclosed herein is a novel circuit technique and method to detect SET disturbances and nearly eliminate all clocking errors in a complementary metal-oxide semiconductor (CMOS) PLL clock generator while adding minimal design complexity and maintaining high quality jitter performance. The PLL fail-over design disclosed herein is a radiation-hardened-by-design PLL solution that will detect SETs that may produce phase errors in one PLL, and then preemptively and seamlessly switch to an alternate error-free PLL thus preventing phase errors from reaching the output.

In a representative embodiment disclosed herein, the fail-over circuit of the present invention is designed utilizing two identical core PLLs with minimally invasive design additions and no additional SET hardening. Select PLL block outputs are ported into an error detection block, and then the error flag signals control the clock multiplexer. The PLL clock outputs are delayed before entering the clock switch thus enabling the errors to be detected and the erroneous clock switched out before the clock disturbance actually propagates to the output. The two PLLs run simultaneously with their output clocks wire-OR connected. When an error is detected, the clock switch logic disables the path of the erroneous clock, leaving only the unaffected clock driving the output.

Particularly disclosed herein is a circuit which comprises first and second substantially identical clock sources producing respective first and second clock signals. First and second delay circuits are coupled to receive respective ones of the first and second clock signals for producing respective first and second delayed clock signals. First and second error detector circuits are coupled to respective ones of the first and second clock sources for producing a respective first and second error signal in response to a phase error in one of the first or second clock sources respectively. A clock switch circuit is coupled to receive the first and second delayed clock signals and the first and second error signal for producing a clock out signal representative of the first delayed clock signal if the second error signal is present and the second delayed clock signal if the first error signal is present.

Also particularly disclosed herein is a method for mitigating single-event transients in an electronic system. The method comprises providing first and second substantially identical clock signals; delaying the first and second clock signals to produce respective first and second delayed clock signals; producing a first and second error signal in response to a phase error in one of said first or second clock signals respectively; and outputting a clock out signal representative of the first delayed clock signal if the second error signal is present and the second delayed clock signal if the first error signal is present.

Further particularly disclosed herein is a method for mitigating single-event transients in an electronic system. The method comprises providing substantially identical first and second phase-locked loops; producing delayed first and second clock signals from the first and second phase-lock loops respectively; monitoring outputs of the first and second phase-locked loops for errors comprising high frequency transients or differences in clock signal outputs from a reference frequency; and outputting a clock out signal representative of the first delayed clock signal if an error is detected in the second phase-locked loop and outputting the second delayed clock signal if an error is detected in the first phase-locked loop.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
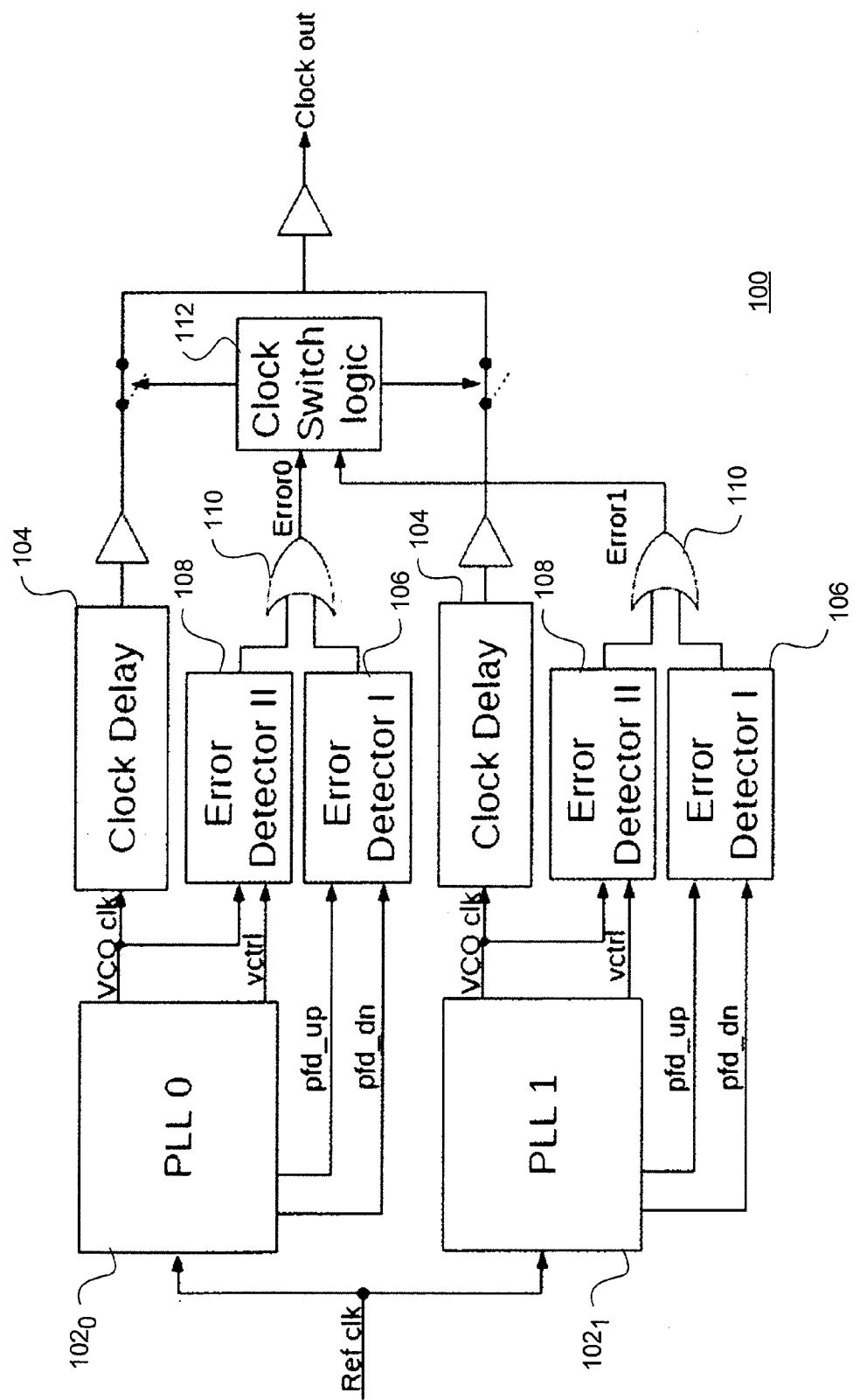
FIG. 1 is a functional block diagram of an embodiment of a PLL fail-over circuit design in accordance with the technique and method of the present invention.

With reference now to FIG. 1, a functional block diagram of an embodiment of a PLL fail-over circuit 100 in accordance with the technique and method of the present invention is shown. The circuit 100 comprises, in pertinent part, a pair of PLL modules $102_0$ and $102_1$ each receiving a reference clock signal (Ref clk) as indicated.

Each of the PLL modules 102 provide separate voltage controlled oscillator clock signals (VCO clk), voltage control (Vctrl) and phase-frequency detector up and down signals (pfd_up; pfd_dn) as shown. The VCO clk signals are supplied to a respective clock delay circuit 104 each of which may be conveniently provided as a number of series coupled inverters. The VCO clk signals are also furnished as one input to a respective Type II error detector circuit 108 along with the corresponding Vctrl signal. Further detail of the Type II error detector circuits 108 will be disclosed hereinafter.

The pfd_up and pfd_dn signals are provided as input to a respective Type I error detector circuit 106, the details of which will also be further disclosed hereinafter. The outputs of the Type I and Type II error detector circuits 106, 108 for each of the respective PLL modules $102_0$ and $102_1$ are logically ORd through respective OR gates 110 to produce corresponding Error0 and Error1 signals for input to clock switch logic 112. The clock switch logic 112 is then operative to select the output of the appropriate clock delay circuit 104 as will be more fully described hereinafter. Similarly, details of the clock switch logic 112 will also be more fully disclosed hereinafter.

The Type I and Type II error detector circuits 106, 108 are, together with the corresponding OR gate 110, sometimes referred to more generally as an error detector circuit of which there are first and second instances, each associated with a particular one of the first and second clock sources in the form of PLL modules $102_0$ and $102_1$.

Modules PLL 0 ($102_0$) and PLL 1 ($102_1$) are complete, substantially identical phase-locked loops running at an output frequency range of, for example, from 500 MHz up to 2 GHz. The input reference frequency range may be on the order of 100 MHz up to 400 MHz. The error detector circuits 106 and 108 and the clock switching logic 112 are not dependent on the PLL module 102 characteristics with the exception of the Vctrl signal. The voltage controlled oscillator (VCO) control voltage, Vctrl, should ideally be in the range of 300 mV to 700 mV to ensure correct operation of the Type II error detector circuits 108.

The clock delay circuit 104 may comprise a fully differential clock delay buffer implemented by a chain of inverters with cross-coupling to balance the duty cycle of both the positive and negative clock paths. The error detector circuits 106 (Type I) detect errors based on each PLL clock's alignment to a reference clock, which may be assumed to be ideal and will never be in error. The error detector circuits 108 (Type II) detect errors on each PLL clock source independently by sensing high frequency transients on the oscillator control voltage caused by SETs at the charge pump.

Figure 2:
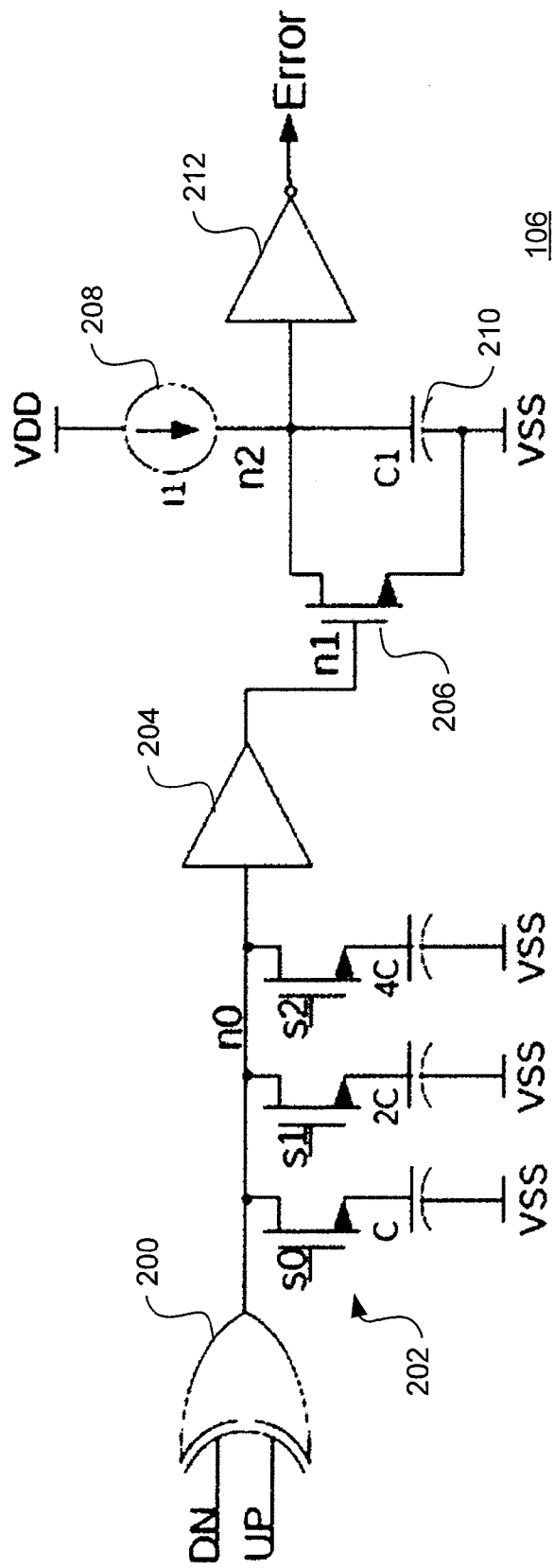
FIG. 2 is a schematic illustration of a Type I error detector circuit for possible use in conjunction with the PLL fail-over circuit design of the preceding figure.

With reference additionally now to FIG. 2, a schematic illustration of a Type I error detector circuit 106 is shown for possible use in conjunction with the PLL fail-over circuit 100 of the preceding figure. The error detector circuit 106 comprises an exclusive OR (XOR) gate 200 which receives the pfd_up and pfd_dn (here UP and DN respectively) from the corresponding one of the PLL modules 102.

The output of the XOR gate 200 at node n0 is passed through a filter 202 and supplied to the input of a buffer 204. The output of the buffer 204 at node n1 is applied to the gate terminal of transistor 206. The drain terminal of transistor 206 at node n2 receives a current it from current source 208 coupled to a supply voltage VDD and a capacitor 210 (C1) is coupled between node n2 and the source terminal of transistor 206 at circuit ground (VSS). An inverter 212 has its input coupled to node n2 and provides an output error signal (Error) as shown.

The Type I error detector circuits 106 are designed around the bang-bang phase-frequency detector (pfd) up and down commands from each respective PLL module 102. The edge alignment of these signals corresponds to the phase difference between the PLL module's clock and the reference clock (Ref clk). The bang-bang pfd is operative to generate a pulse at each up and down signal. Consequently, the difference between the pulses directs the change. When the PLL is locked, these signals should have equal pulse widths and, therefore, the XOR result at node n0 should be a logic zero.

When the PLL feedback clock is leading or lagging the reference clock, there is a difference in pulse width between these signals. This difference in pulse widths generates a pulse from the XOR gate 200 of a width proportional to the skew between the UP and DN signals. To eliminate glitching and set the resolution of the error detector circuit 106, the resultant pulse from the XOR gate 200 is passed through a filter 202 with selectable delay. The delay of the filter 202 is programmable by using trim signals s[2:0] to connect or disconnect the capacitor banks (e.g. C, 2C, 4C) to the XOR gate 200 output. When the UP/DN pulse difference is large enough to propagate through the filter 202, the error flag (Error) is triggered. Once triggered, the error flag remains active until the UP and DN pulse skew falls below the desired level for a determined period of time.

In operation, the signals should be stable for on the order of several microseconds. This period is determined by the size of capacitor 210 (C1) and the value of the charging current it from current source 208. This delay helps ensure that the PLL has re-acquired lock should it have been lost due to a SET.

Figure 3:
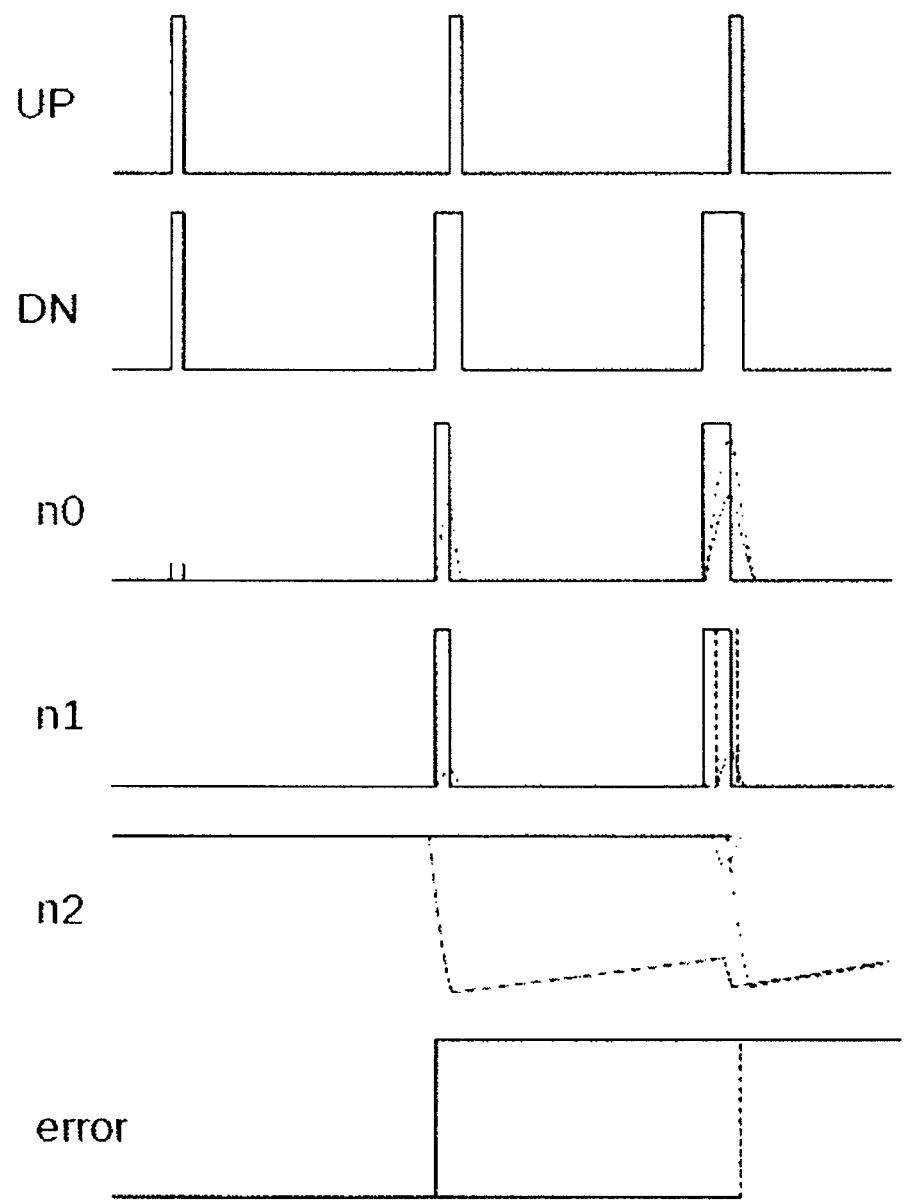
FIG. 3 illustrates some waveforms for the Type I error detector circuit of the preceding figure in which the solid, dashed and fine dashed lines represent differing skew resolution and the node n0 and n1 pulses are rejected or passed, discharging node n2 depending on the selected skew setting.

With reference additionally now to FIG. 3, some representative waveforms for the error detector circuit 106 of the preceding figure are shown in which the solid, dashed and fine dashed lines represent differing skew resolution and the node n0 and n1 pulses are rejected or passed, discharging node n2, depending on the selected skew setting.

The minimum resolution of the error flag generator in the representative embodiment shown is about 60 ps, so phase skew between the reference and feedback clock less than this value will not be detected. SET strikes to the pfd and feedback dividers will immediately trigger the Type I error detector circuit 106 because strikes on these circuits directly affect the reference and feedback clocks being compared. Due to VCO clock division, SET strikes that produce a more gradual phase disturbance allow phase error to accumulate on the fast VCO clock before the phase error is detected by the Type I error detector circuit 106. This behavior is shown in the following figure.

Figure 4:
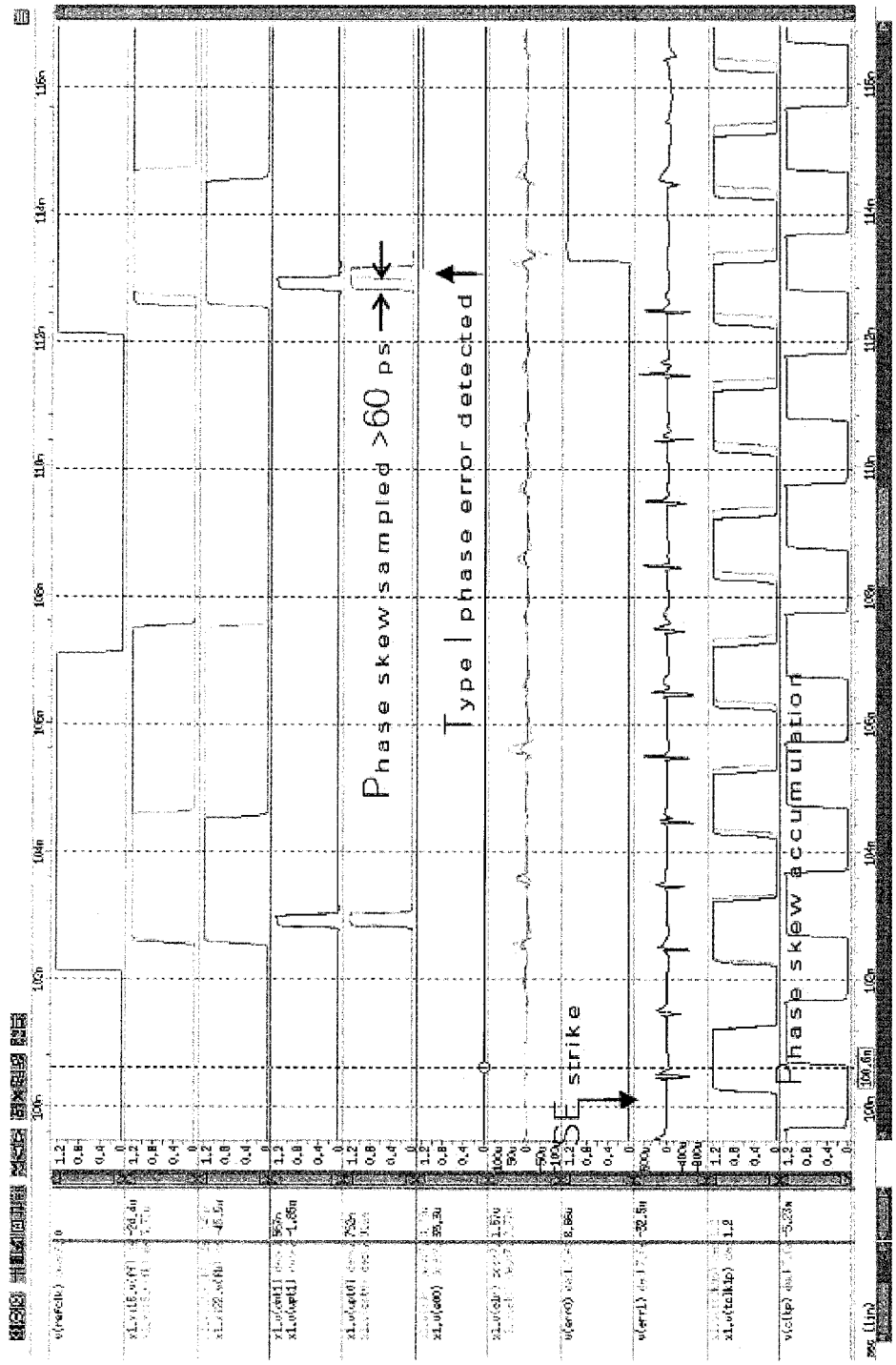
FIG. 4 illustrates some waveforms for the Type I error detector of the preceding figures showing phase error accumulation and detection and wherein the divided clock and reference clocks are sampled after phase error has accumulated on the fast VCO clock.

With reference additionally now to FIG. 4, representative waveforms for the Type I error detector circuit 106 of the preceding figures are illustrated showing phase error accumulation and detection and wherein the divided clock and reference clocks are sampled after phase error has accumulated on the fast VCO clock. As can be determined, this simulation shows that there is more than 60 ps of phase error at the VCO clock before the sampled skew between the divided feedback clock and the reference clock reaches the error detector's trip point.

Figure 5:
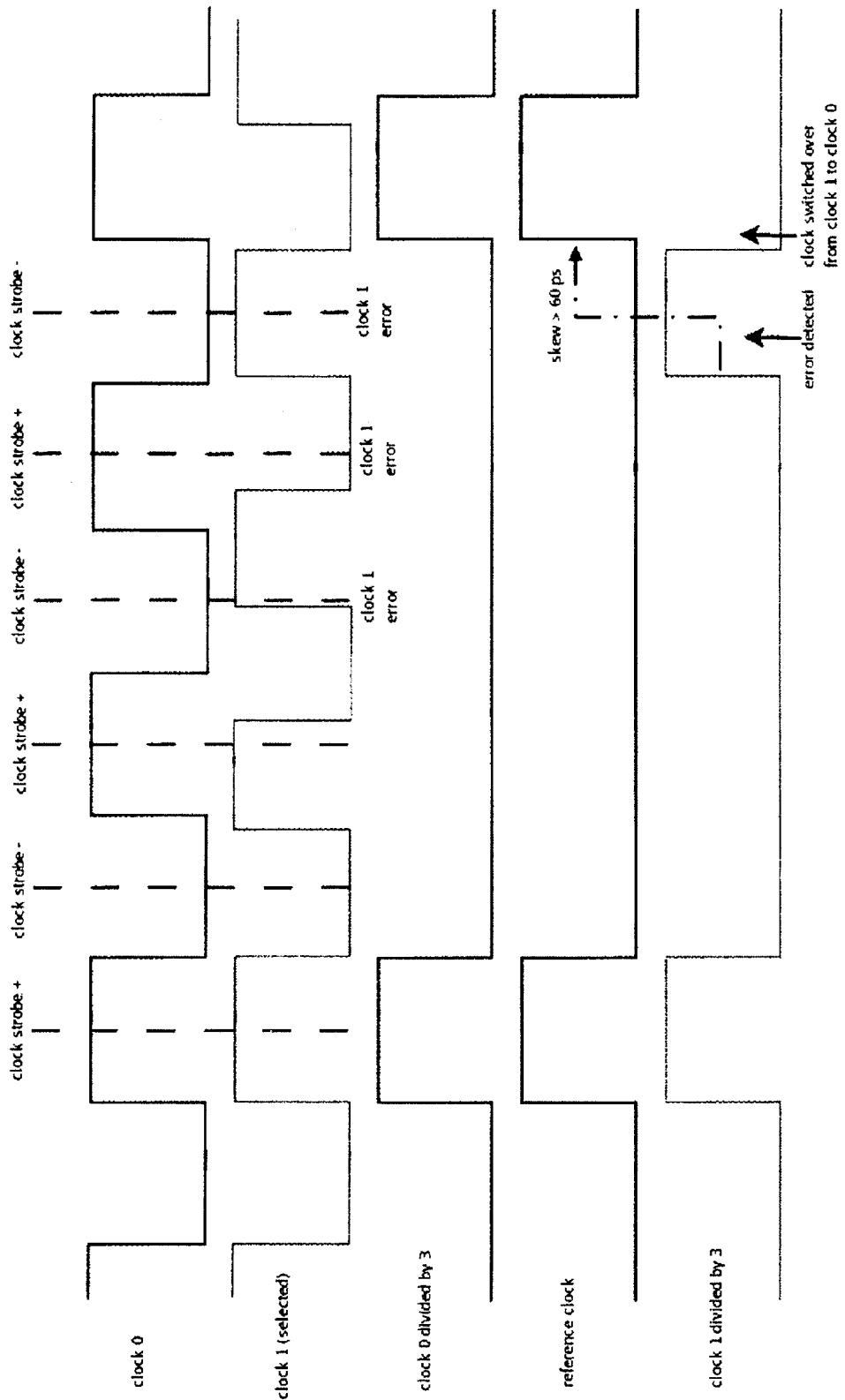
FIG. 5 illustrates some waveforms showing VCO clock errors are incurred due to the limited response time of the Type I error detector when running with clock multiplication.

With reference now to FIG. 5, representative waveforms are illustrated showing that VCO clock errors are incurred due to the limited response time of the Type I error detector circuit 106 of the preceding figures when running with clock multiplication.

As can be determined, the pfd compares the reference clock to a divided VCO clock, so it is possible to take several errors on the fast VCO clock before the clock skew is detected if there is a severe SET strike on a sensitive bias voltage. This type of rapid error accumulation typically occurs only when the VCO control voltage is disturbed by SET strikes at the charge pump. The Type II error detector circuit 108 of FIG. 1 is designed to address this behavior and is described in greater detail with respect to the following figure.

Figure 6:
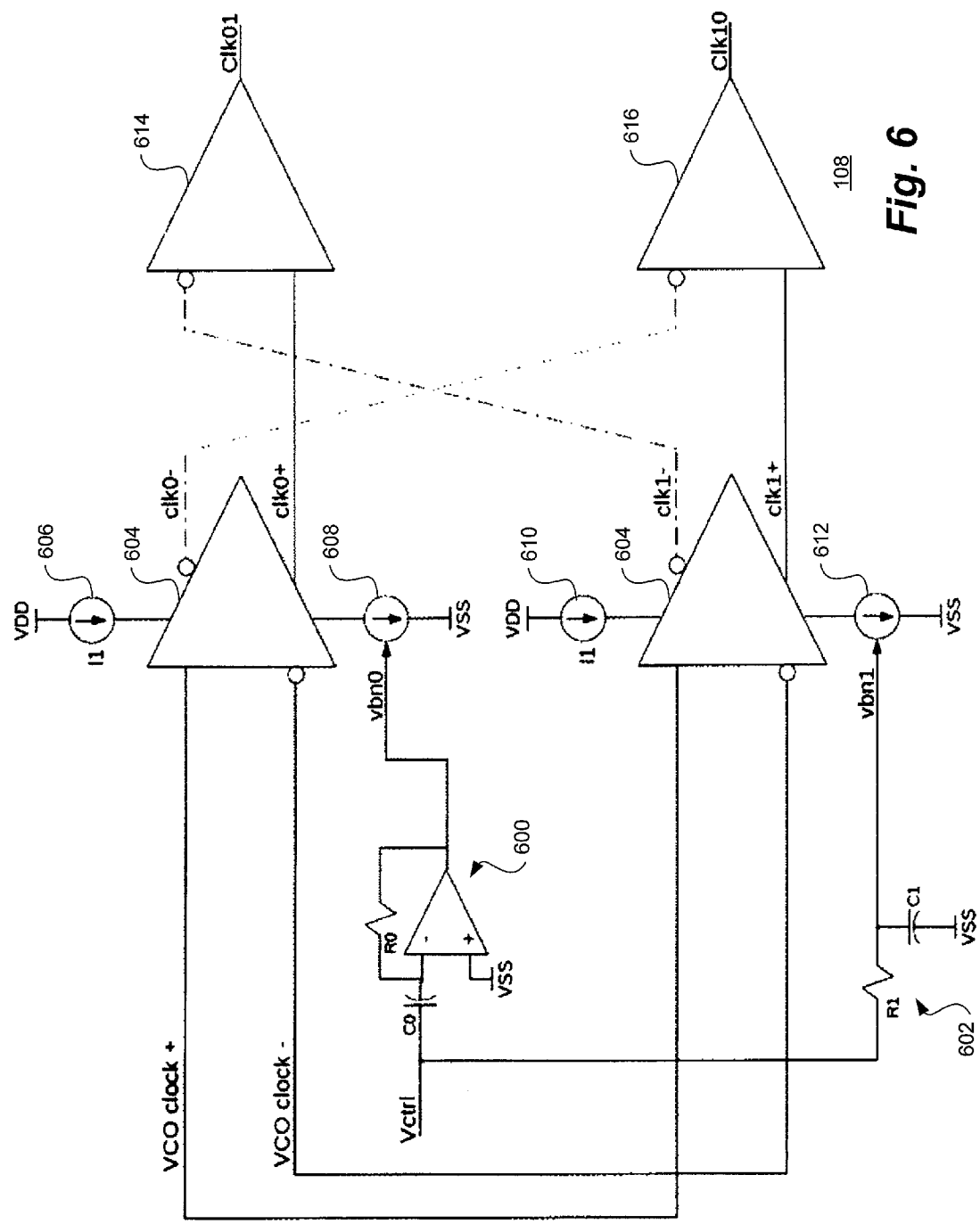
FIG. 6 is a schematic illustration of a Type II error detector wherein the circuit converts voltage excursions on Vctrl into a phase delta between the signals Clk01 and Clk10.

With reference additionally now to FIG. 6, a schematic illustration of a Type II error detector circuit 108 is shown wherein the circuit converts voltage excursions on Vctrl into a phase delta between the signals Clk01 and Clk10. The error detector circuit 108 comprises, in pertinent part, a differentiator 600 for coupling the Vctrl output of a corresponding one of the PLL modules $102_0$ and $102_1$ (FIG. 1) to a vbn0 signal and to a vbn1 signal through a low-pass filter 602. A pair of clock buffers 604 are each coupled to receive the differential VCO clock signal VCO clock+ and VCO clock−. A first one of the clock buffers 604 is coupled between current sources 606 and 608, the latter current source being controlled by the signal vbn0 while the other one of the clock buffers 604 is coupled between current sources 610 and 612 with the latter current source being controlled by the signal vbn1. The outputs of the clock buffers 604 are coupled to differential-to-single-ended buffers 614 and 616 to produce signals Clk01 and Clk10 respectively. Although not illustrated, the CLk01 and Clk10 signals are then applied to another Type I error detector circuit 106 as the DN and UP signals illustrated in FIG. 2 to provide an error output signal to the corresponding OR gate 110 (FIG. 1).

In operation, the error detector circuits 108 are designed to sense drastic changes in the VCO control voltage (Vctrl) and then convert the voltage excursion into a detectable phase delta. Because the delay through the buffers used in the oscillator is controlled by the PLL loop filter voltage, any changes on this voltage should change the delay of a signal propagating through one of these buffers. The oscillator's fast output clock is fed into a pair of controlled delay lines where the control voltage is a copy of the oscillator's control voltage. By adding a differentiator 600 to one of the unity gain amplifiers used to generate the delay line control voltage, high frequency transients in the control voltage can be detected. The alternate delay line's control voltage buffer is followed by a low-pass filter 602 so high frequency transients do not propagate. In the representative embodiment shown, the bandwidth for these filters may be on the order of about 4 MHz and this value was chosen based on investigation of SET pulse shape and duration presented in B. Narasimham, B. Bhuva, R. Schrimpf, L. Massengill, M. Gadlage, O. Amusan, W. Holman, A. Witulski, W. Robinson, J. Black, J. Benedetto, and P. Eaton, "Characterization of Digital Single Event Transient Pulse-Widths in 130-nm and 90-nm CMOS Technologies," IEEE Trans. Nucl. Sci, vol. 54, no. 6, pp. 2506-2511, December 2007; the reference M. Gadlage, R. Schrimpf, J. Benedetto, P. Eaton, D. Mavis, M. Sibley, K. Avery, and T. Turflinger, "Single Event Transient Pulsewidths in Digital Microcircuits," IEEE Trans. Nucl. Sci, vol. 51, no. 6, pp. 3285-3290, December 2004; and the estimated PLL loop bandwidth.

The control voltage transients are converted into a detectible phase skew by generating differential current-mode logic (CML) clocks with an amplitude and voltage offset determined by the control voltage. When the control voltage is stable on both CML clock buffers, the output clock amplitudes and offset should be equal. Therefore, a differential CML-to-single-ended CMOS clock generated by the cross-coupled signals should result in digital clocks with all edges phase aligned. A high-speed transient on the control voltage should instantly affect the control voltage on the path with the differentiator 600, thus changing the CML output clock amplitude and offset for this path. The alternate path should not change instantly, so the CML output clocks for this path should remain unchanged. The differential CML to single-ended CMOS buffer resolves edges by detecting the voltage crossing levels of the differential signal. After the transient disturbance on the control voltage, the offset and amplitudes for each pair of differential inputs are different. This difference results in a change in the duty cycle of the single-ended output clock as shown in the representative waveforms of the following figure.

Figure 7:
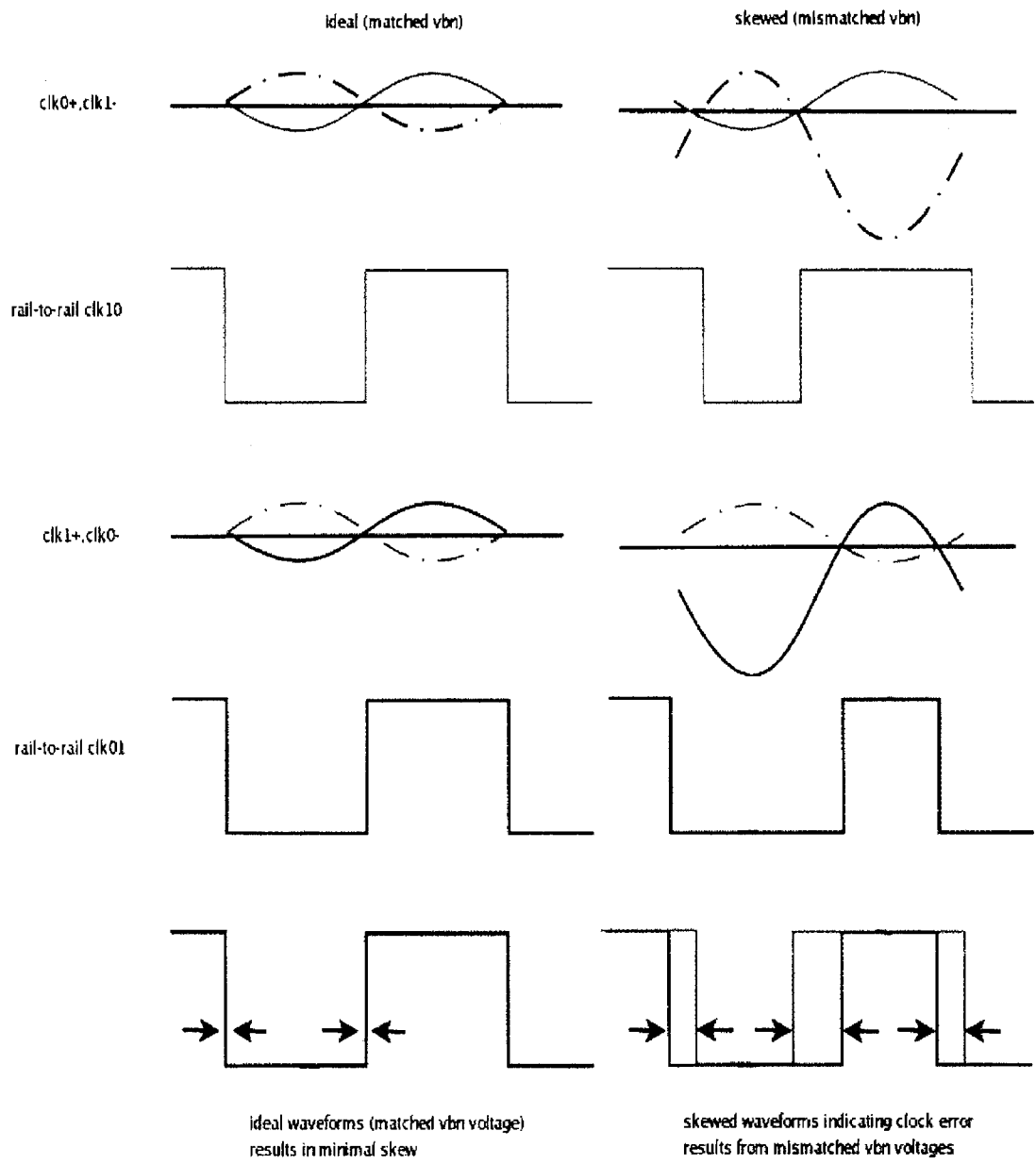
FIG. 7 illustrates some Type II error detector operation waveforms.

With reference additionally now to FIG. 7, representative Type II error detector circuit 108 operation waveforms are shown. As mentioned previously, the same XOR clock comparison and error flag generator from the Type I error detector circuit 106 (FIG. 2) is used to compare Clk10 against Clk01. Excessive skew between these clocks will generate a pulse proportional to the phase skew between clocks. Once again, the amount of allowable skew is programmable from 60 ps to 150 ps. Adjusting this skew limit helps to offset the error detector circuit 108 due to inherent skew caused by mismatch between the delay buffer control voltages. Ultimately, the phase skew between these clocks is proportional to the amplitude of the voltage transient on the VCO control voltage, so a severe SET strike at the charge pump will result in an error flag. In this manner, the potential output clock disturbance is detected and may be averted by the clock multiplexer switch. The following figure shows a simulation of the Type II error detector circuit 108 operating with a PLL.

Figure 8:
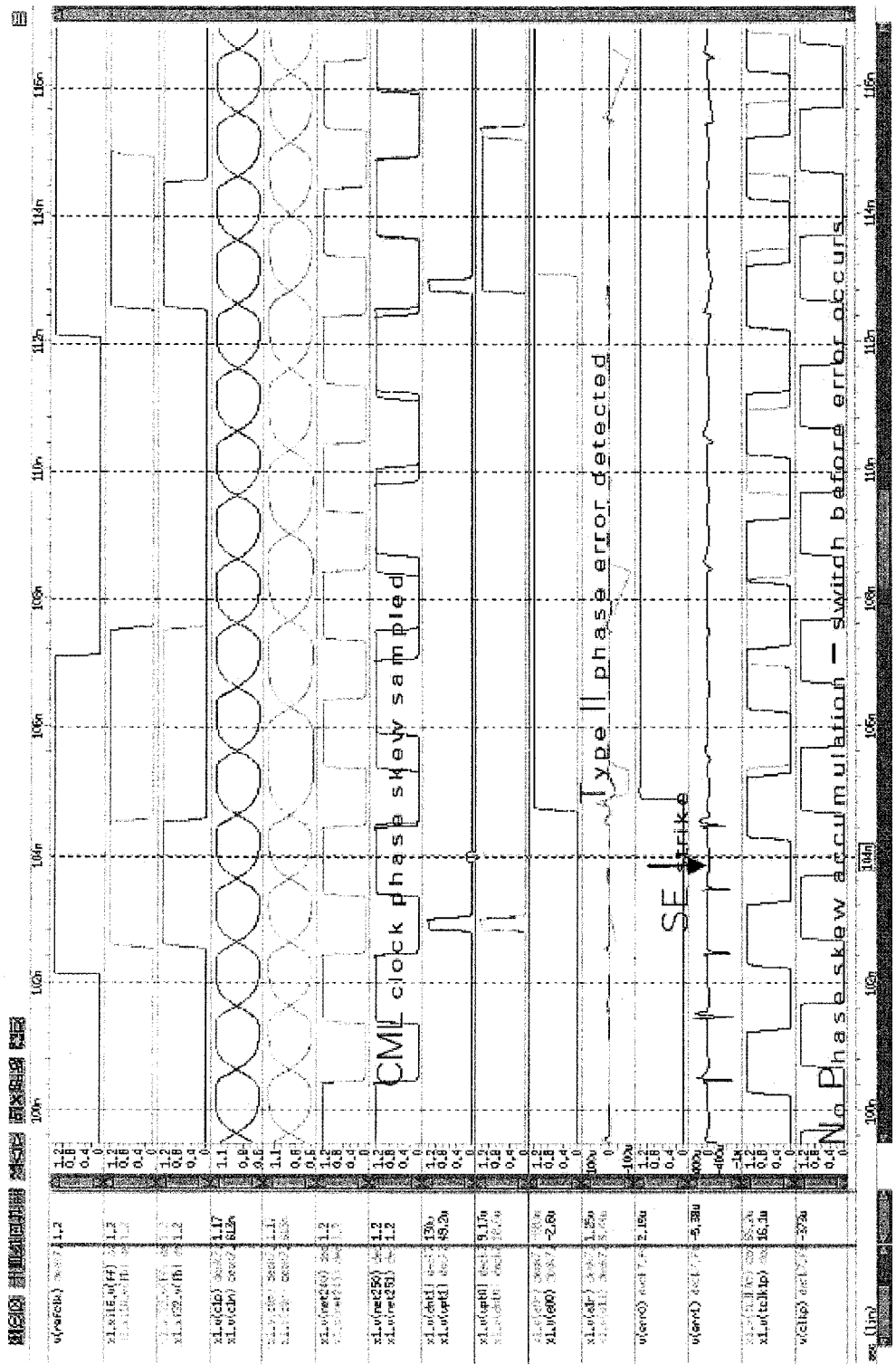
FIG. 8 illustrates some simulated Type II error detector and PLL clock switch-over waveforms.

With reference additionally now to FIG. 8, representative waveforms for a simulated Type II error detector circuit 108 and PLL clock switch logic 112 are shown. The clock switch logic 112 will be more fully described hereinafter.

The clock switch logic 112 (FIG. 1) processes the outputs from the error detector circuits 106 and 108, determines which PLL module $102_0$ and $102_1$ is in error, then shuts off the output clock path of the PLL module 102 in violation. Another feature of the clock switch logic 112 is the additional clock delay through clock delay circuit 104 from the PLL module 102 outputs to the clock switch logic 112. This delay should be long enough such that the error detection and clock switching occur before the clock disturbance propagates to the switch clock logic 112 output. The error signals, Error0 and Error1 are Type I errors or Type II errors for each respective PLL module 102. These error signals are evaluated by combinational logic in the clock switch logic 112. The PLL clock path in error is switched out only if only one PLL is in error. If all error flags are simultaneously high, nothing happens. One PLL path will always be selected as it is not possible to deselect both PLL clock paths.

The clock multiplexer used in the switch over circuit is designed for clock frequencies up to 2 GHz. Each clock path should be matched since mismatch in propagation delay between clock paths can show up as output jitter when the clock switch logic 112 trips. In operation, the jitter was evaluated before and after layout and the paths were closely matched resulting in minimal jitter when switching clocks.

Figure 9:
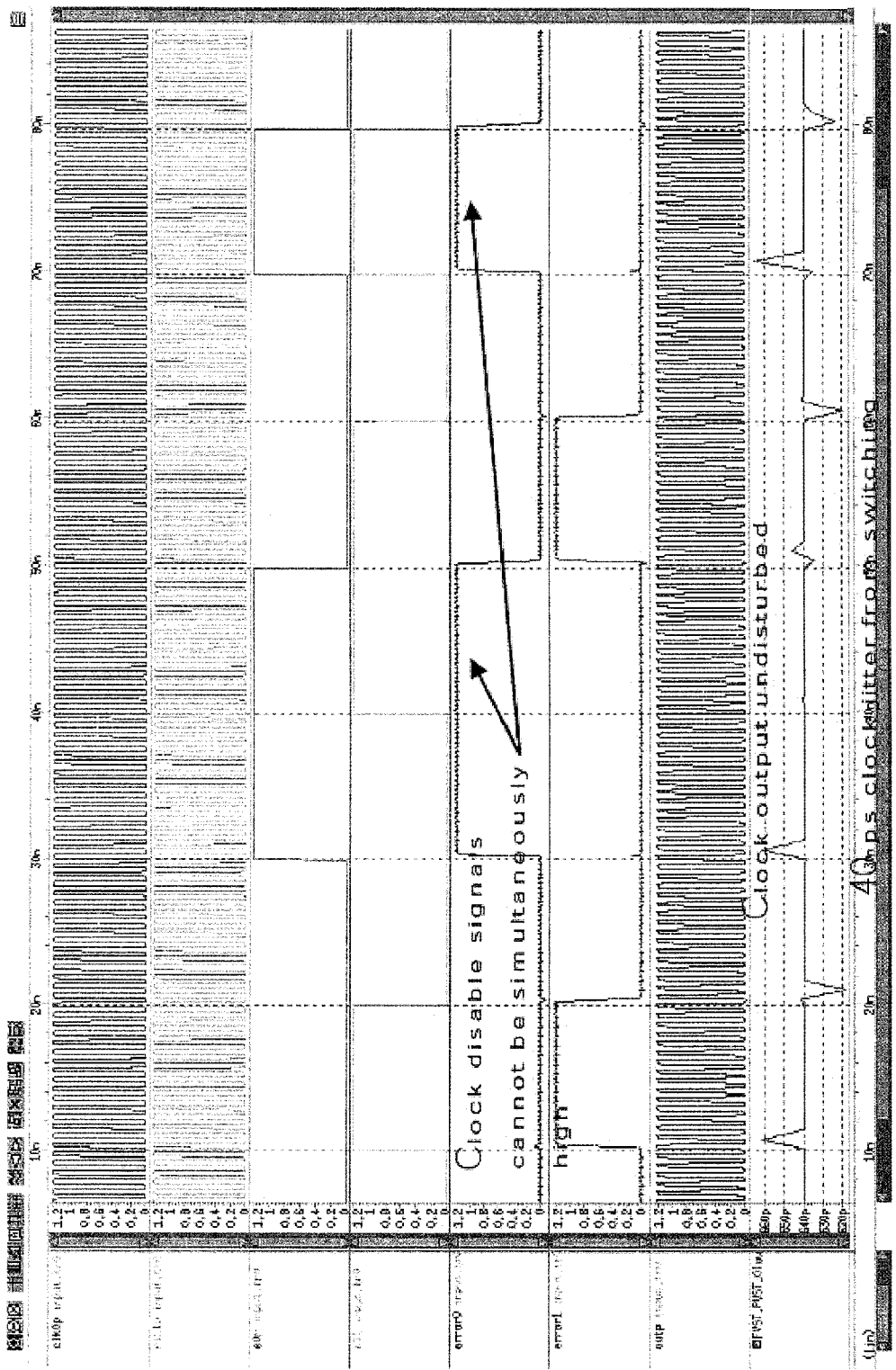
FIG. 9 illustrates some simulated Type II PLL clock switch waveforms showing that the switching introduces minimal clock jitter.

With reference additionally now to FIG. 9, representative simulated Type II PLL clock switch logic waveforms are illustrated showing that the switching introduces minimal clock jitter as mentioned previously.

Figure 10:
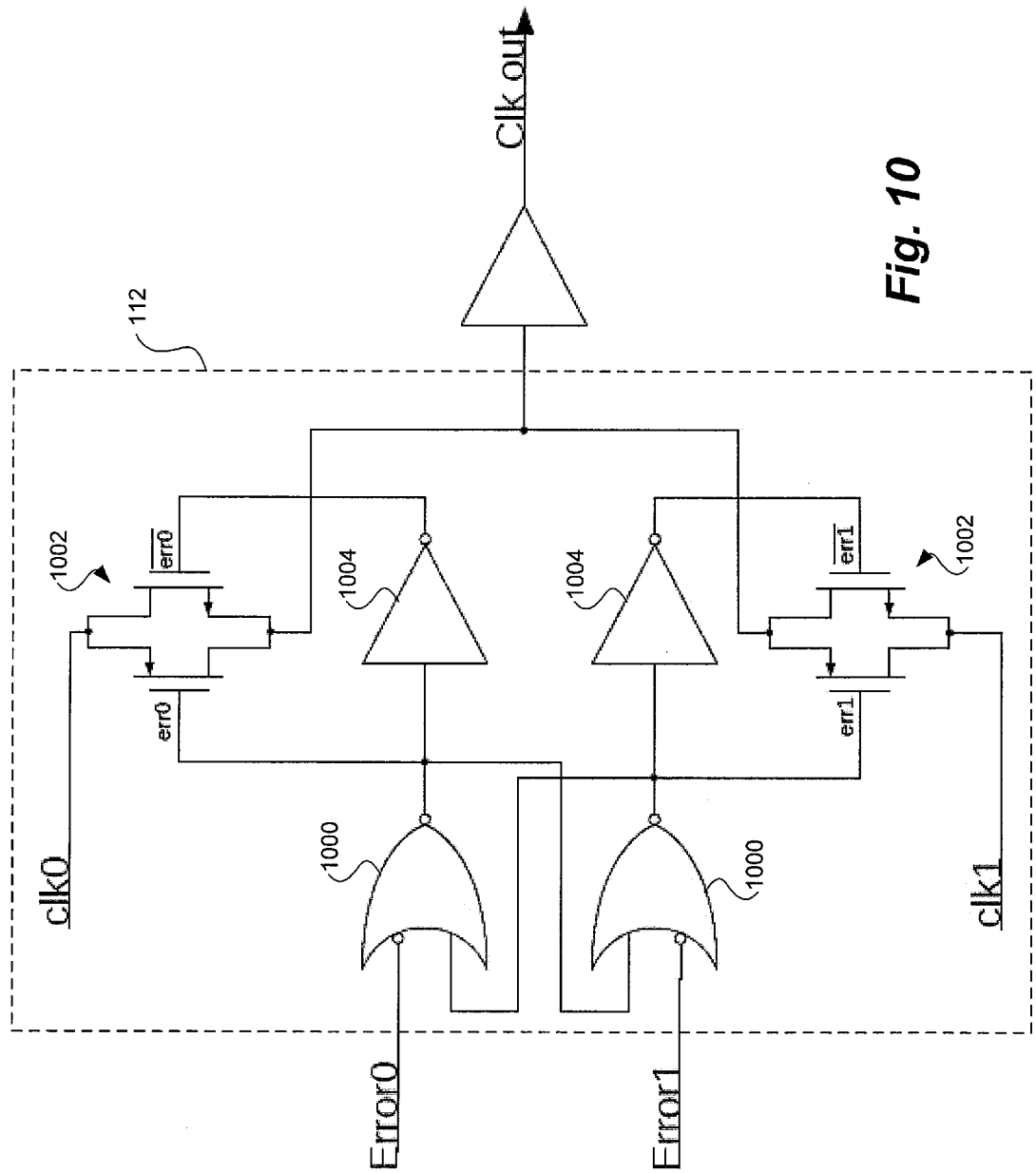
FIG. 10 is a schematic illustration of a possible implementation of the clock switch logic of FIG. 1.

With reference additionally now to FIG. 10, a schematic illustration of a possible implementation of the clock switch logic 112 of FIG. 1 is shown. The clock switch logic 112 receives the Error0 and Error1 outputs of the OR gates 110 (FIG. 1) through a pair of cross-coupled NOR gates 1000. Outputs of the NOR gates 1000 are supplied as inputs to respective transmission (or pass) gates 1002 and inverters 1004 as shown. The transmission gates 1002 are operative to couple either the clk0 or clk1 clock signals output through one of the clock delay circuits 104 as received from either of the PLL modules $102_0$ or $102_1$ as the Clock Out (Clk out) signal.

Comparison of the PLL fail-over circuit 100 simulation results against previous work shows that the fail-over technique was successful in reducing the number of clocking errors due to SET in PLLs. Direct comparison of the PLL fail-over circuit 100 solution against previous SET hardening efforts is somewhat challenging because most of the previous work has focused on hardening specific PLL components, rather than addressing the PLL as a whole. The most significant comparisons are achievements in hardening against SETs in the charge pump and the VCO.

The voltage charge pump (VCP) presented in T. D. Loveless, L. W. Massengill, and B. L. Bhuva, "A Hardened-by-Design Technique for RF Digital Phase-Locked Loops," IEEE Transactions on Nuclear Science, vol. 53, no. 6, pp. 3432-3438, December 2006 (hereinafter the Loveless et al. article) improved recovery time, phase displacement, and reduced erroneous pulses due to SETs, as did the PLL fail-over circuit 100 of the present invention. The maximum recovery time for the VCP after a 500 fC SET strike was 162 ns compared to less than 1 ns for the PLL fail-over circuit 100, also hit with a 500 fC strike, attributable to the Type II error detector circuit 108 and clock switch logic 112. Strikes of 500 fC in the VCP while running at 850 MHz resulted in a maximum of one erroneous clock pulse.

In the Loveless et al. article, an erroneous clock pulse was defined as $2\pi$ radians (360°) phase displacement. For 500 fC strikes to the charge pump while running at 1.6 GHz, the PLL fail-over circuit 100 of the present invention showed zero erroneous clock pulses, even to a more stringent erroneous pulse definition of $\pi/2$ radians (90°) phase displacement.

While the TMR VCO in T. D. Loveless, L. W. Massengill, B. L. Bhuva, W. T. Holman, "A Radiation-Hardened-by-Design Voltage-Controlled Oscillator for Mixed-Signal Phase-Locked Loops," presentation, SEE Symposium 2008, was effective in reducing the number errors produced by SETs in the VCO, this solution increases power and area consumption by over 3×. The PLL fail-over circuit 100 of the present invention requires just over a 2× increase in power and area and is also very effective in reducing the number of erroneous clocks due to SETs in the VCO.

The PLL fail-over circuit 100 of the present invention also showed improved performance over the radiation hardened PLL presented in R. Kumar, V. Karkala, R. Garg, T. Jindal, and S. P. Khatri. "A Radiation Tolerant Phase-locked loop Design for Digital Electronics," IEEE ICCD 2009, pp. 505-510, October 2009, (hereinafter the Kumar et al. article) which showed very good SET performance at 250 fC simulated SE strikes. The results in the Kumar et al. article showed maximum phase displacement of 1.18 radians or jitter of 18.7% of the clock period (running at 1.06 GHz) due to strikes in the VCO. At 250 fC, the PLL fail-over circuit 100 showed a maximum jitter of roughly 80 ps, only 12.8% of the clock period (running at 1.6 GHz). In the PLL fail-over circuit 100, there was, at 250 fC, one weak node in the clock multiplexer that resulted in 1.9 radians of phase displacement or 60% jitter. This displacement exceeds $\pi/2$ radians, so it was reported as a single clock error. The maximum time to return to the locked state was 16 cycles in the Kumar et al. article and 1 cycle or less in the PLL fail-over circuit 100 because the output immediately switches out the unlocked PLL and relies on the redundant PLL which is still locked. Although power consumption is not specifically addressed in the Kumar et al. article it is suspected that the PLL fail-over circuit 100 would be comparable because the former also requires two VCOs, two charge pumps, and two loop filters. Overall, the PLL fail-over circuit 100 of the present invention performs very well compared to the PLL in the Kumar et al. article and did so at a higher operating frequency.

The TMR PLL presented in T. Wang, L. Chen, and A. Dihn, "A Single-Event Transients Tolerant Monolithic Phase-Locked Loops Design," University of Saskatchewan College of Engineering, March 2010 showed no errors due to SET strikes in any single VCO while operating at 800 MHz. There was no indication of how many other nodes were simulated with SET strikes, but the PLL showed no errors when striking one of the most sensitive subcircuits, the VCO. While the TMR solution appears to be extremely effective in SET hardening, the power consumption and area penalty are among its shortcomings. While power is not specifically addressed, one can reasonably assume that the TMR PLL would require over 3× increases in power and area. The PLL fail-over circuit of the present invention was very robust in SET clock error mitigation showing a maximum of only six clock errors and immediate recovery at SETs above 100 MeV-cm2/mg. The PLL fail-over circuit 100 is favorable in terms of area and power consumption because it needs only 2× increases above the non-hardened PLL versus over 3× increases for the TMR PLL.

Table 1 below summarizes the PLL fail-over circuit of the present invention compared to other radiation hardened PLL solutions mentioned above. The table and analysis above show that the detection and fail-over technique presented is not only effective in mitigation of SET clock disturbance, but is also efficient in terms of power and design.

TABLE I

Comparison of PLL fail-over solution against other SET hardened PLL designs.

| | VCP PLL [1] | Dual-loop PLL [2] | TMR PLL | PLL fail-over circuit 100 | |
|---|---|---|---|---|---|
| Frequency | 850 MHz | 1.06 GHz | 800 MHz | 1.6 GHz | |
| Simulated Q | 500 fC | 250 fC | 200 fC* | 250 fC/ 500 | 250 fC/ 500 |
| Max displacement | 6.28 rad | 1.18 rad | -none- | <0.25 rad/ <0.25 rad | 0.4 rad/ 1.56 rad |
| Node struck | Charge pump | VCO | VCO | Charge pump | VCO |
| Power & area increase | minimal | >2× | >3× | >2× | >2× |

*Not specified, but implied by the values chosen for the SE strike current pulse.
[1] Loveless et al.
[2] Kumar et al.

While there have been described above the principles of the present invention in conjunction with specific circuitry, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A circuit comprising:
   first and second substantially identical clock sources producing respective first and second clock signals;
   first and second delay circuits coupled to receive respective ones of said first and second clock signals for producing respective first and second delayed clock signals;
   first and second error detector circuits coupled to respective ones of said first and second clock sources for producing a respective first and second error signal in response to a phase error in one of said first or second clock sources respectively; and
   a clock switch circuit coupled to receive said first and second delayed clock signals and said first and second error signal for producing a clock out signal representative of said first delayed clock signal if said second error signal is present and said second delayed clock signal if said first error signal is present.

2. The circuit of claim 1 wherein said first and second substantially identical clock sources comprise phase-locked loops.

3. The circuit of claim 1 wherein said first and second delay circuits comprise series coupled inverters.

4. The circuit of claim 1 wherein each of said first and second error detector circuits comprise third and fourth error detector circuits, said third error detector circuits being responsive to differences in said first and second clock signals from a reference clock input to said first and second clock sources and said fourth error detector circuits being responsive to high frequency transients in said first and second clock sources.

5. The circuit of claim 4 wherein outputs of said third and fourth error detector circuits are logically ORd to produce said first and second error signals.

6. The circuit of claim 4 wherein said third error detector comprises an XOR gate coupled to a filter.

7. The circuit of claim 4 wherein said fourth error detector comprises a pair of buffers receiving a control signal from one of said first and second clock sources.

8. The circuit of claim 7 wherein a first one of said pair of buffers receives said control signal through a differentiator and a second one of said pair of buffers receives said control signal through a low-pass filter.

9. The circuit of claim 4 wherein said third error detector circuits receive up and down phase-frequency signals from said first and second clock sources respectively.

10. A method for mitigating single-event transients in an electronic system comprising:
    providing first and second substantially identical clock signals;
    delaying said first and second clock signals to produce respective first and second delayed clock signals;
    producing a first and second error signal in response to a phase error in one of said first or second clock signals respectively; and
    outputting a clock out signal representative of said first delayed clock signal if said second error signal is present and said second delayed clock signal if said first error signal is present.

11. The method of claim 10 wherein said step of providing first and second clock signals is carried out by first and second substantially identical phase-locked loops.

12. The method of claim 10 wherein said step of delaying said first and second clock signals is carried out by series coupled inverters.

13. The method of claim 10 wherein said step of producing a first error signal is carried out by a first error detector circuit responsive to a difference in one of said first and second clock signals from a reference clock and said step of producing a second error signal is carried out by a second error detector circuit responsive to high frequency transients in one of said first and second clock signals.

14. The method of claim 10 further comprising the step of: logically ORing said first and second error signals.

15. The method of claim 10 wherein said step of outputting a clock out signal is carried out by clock switch logic.

16. A method for mitigating single-event transients in an electronic system comprising:
   providing substantially identical first and second phase-locked loops;
   producing delayed first and second clock signals from said first and second phase-lock loops respectively;
   monitoring outputs of said first and second phase-locked loops for errors comprising high frequency transients or differences in clock signal outputs from a reference frequency; and
   outputting a clock out signal representative of said first delayed clock signal if an error is detected in said second phase-locked loop and outputting said second delayed clock signal if an error is detected in said first phase-locked loop.

17. The method of claim 16 wherein said step of producing delayed first and second clock signals is carried out by series coupled inverters.

18. The method of claim 16 wherein said step of monitoring outputs of said first and second phase-locked loops is carried out by a first error detector circuit responsive to a difference in an output of one of said first and second phase-locked loops from a reference clock.

19. The method of claim 18 wherein said step of monitoring outputs of said first and second phase-locked loops is carried out by a second error detector circuit responsive to high frequency transients in an output of one of said first and second phase-locked loops.

20. The method of claim 19 further comprising the step of: logically ORing outputs of said first and second error detector circuits for input to clock switch logic to produce said clock out signal.

* * * * *